United States Patent [19]
Nishitani et al.

[11] Patent Number: 5,798,483
[45] Date of Patent: Aug. 25, 1998

[54] GROUNDING DEVICE FOR AN IMAGE FORMING MACHINE

[75] Inventors: Kazuhiro Nishitani; Haruya Osaka, both of Osaka, Japan

[73] Assignee: Mita Industrial Co., Ltd., Osaka, Japan

[21] Appl. No.: 753,763

[22] Filed: Nov. 29, 1996

[30] Foreign Application Priority Data

Nov. 29, 1995 [JP] Japan ................................ 7-311080

[51] Int. Cl.⁶ ........................................... H01Q 1/00
[52] U.S. Cl. ........................................... 174/51; 439/620
[58] Field of Search ............................. 174/51; 439/620; 399/90

[56] References Cited

U.S. PATENT DOCUMENTS

| | | | |
|---|---|---|---|
| 4,145,674 | 3/1979 | King et al. | 333/181 |
| 4,218,687 | 8/1980 | Faigen et al. | 343/885 |
| 4,622,527 | 11/1986 | Carlson | 333/182 |
| 4,995,834 | 2/1991 | Hasegawa | 439/620 |
| 5,267,125 | 11/1993 | Liu | 361/816 |
| 5,599,208 | 2/1997 | Ward | 439/620 |

*Primary Examiner*—Hyung S. Sough
*Assistant Examiner*—Joseph Waks
*Attorney, Agent, or Firm*—Antonelli, Terry, Stout & Kraus, LLP

[57] ABSTRACT

A grounding device for use with an image forming machine includes an electric conductive member and radio wave absorbing device associated with the electric conductive member. The electric conductive member is composed of a metal plate or a metal bar. The radio wave absorbing device is composed of a radio wave absorbing member containing sintered ferrite or ferrite particles, a radio wave absorbing sheet piece containing ferrite particles, or a radio wave absorbing paint containing ferrite particles.

5 Claims, 6 Drawing Sheets

GROUNDING DEVICE FOR AN IMAGE FORMING MACHINE

FIELD OF THE INVENTION

This invention relates to a grounding device for use in directly or indirectly connecting an electric conductive frame, an electric conductive case, an electric conductive brush, or an electric conductive pattern on a circuit board to a grounding terminal in an image forming machine such as a copier, a facsimile machine or a printer.

DESCRIPTION OF THE PRIOR ART

As is well known, an image forming machine such as a copier, a facsimile machine or a printer generates noise which induces electromagnetic interference. This noise includes conducted noise that might be propagated to other equipment through a power line or a signal wire, and radiated noise that might be propagated to other equipment through space. Recently, there has been a growing demand that the generation of noise be fully suppressed to avoid the problem of electromagnetic interference. A generally proposed manner of reducing noise is to associate radio wave absorbing means with a power line and/or a signal wire. According to our experience, however, this generally adopted manner cannot suppress the generation of noise fully effectively in an image forming machine.

SUMMARY OF THE INVENTION

An object of the present invention is to provide a simple and inexpensive grounding device which, when applied to an image forming machine, can effectively suppress noise the image forming machine generates.

We have extensively studied the generation of noise in an image forming machine from various points of view. As a result, we have found that noise, especially, radiated noise, can be fully effectively suppressed by associating radio wave absorbing means with an electric conductive member which is used in the image forming machine as a grounding device for directly or indirectly connecting an electric conductive frame, an electric conductive case, an electric conductive brush, or an electric conductive pattern on a circuit board to a ground terminal. We have also found that both conducted noise and radiated noise can be fully effectively suppressed by forming the electric conductive member, used as the grounding device, from a metal plate or a metal bar having a high electric conductivity, and associating radio wave absorbing means with such electric conductive member.

As a grounding device which attains the above-described object, the present invention provides a grounding device for use with an image forming machine, the grounding device comprising an electric conductive member, and radio wave absorbing means associated with the electric conductive member.

Preferably, the electric conductive member is formed of a metal plate or a metal bar having high electric conductivity and a relatively large (compared with a thin wire) cross-sectional area. It is preferred that the radio wave absorbing means be composed of a radio wave absorbing member having a through-hole, and that at least a part of the electric conductive member extend through the through-hole of the radio wave absorbing member. Preferably, the radio wave absorbing member contains sintered ferrite, or ferrite particles.

In a preferred embodiment, the electric conductive member is formed of a metal plate extending through the through-hole of the radio wave absorbing member, and an elastically compressed filler member is placed between the inner surface of the through-hole of the radio wave absorbing member and the metal plate, whereby the radio wave absorbing member is fixed to the electric conductive member. In another preferred embodiment, the electric conductive member is formed of a metal plate having a main portion and a locking arm integrally joined to the main portion. The main portion of the metal plate extends through the through-hole of the radio wave absorbing member, and the locking arm elastically engages the outer surface of the radio wave absorbing member, whereby the radio wave absorbing member is fixed to the electric conductive member. The radio wave absorbing means is composed of two radio wave absorbing members different from each other in radio wave absorbing properties, and at least a part of the electric conductive member may extend through the through-holes of the two radio wave absorbing members. It is also permissible to form the electric conductive member from a metal plate, and pass the electric conductive member through the through-hole of the radio wave absorbing member a plurality of times.

In another preferred embodiment, the electric conductive member is formed of a metal bar extending through the through-hole of the radio wave absorbing member, and an elastically compressed filler member is placed between the inner surface of the through-hole of the radio wave absorbing member and the metal bar, whereby the radio wave absorbing member is fixed to the electric conductive member.

The radio wave absorbing means may be composed of a radio wave absorbing sheet piece, and may be bonded to the surface of the electric conductive member. Preferably, the radio wave absorbing sheet piece contains ferrite particles or sintered product of ferrite. Alternatively, the radio wave absorbing means may be composed of a radio wave absorbing paint coated onto the electric conductive member. The radio wave absorbing paint preferably contains ferrite particles.

DETAILED DESCRIPTION OF THE PREFERRED EMBODIMENTS

The present invention will now be described in more detail by reference to the accompanying drawings illustrating preferred embodiments of a grounding device constructed in accordance with the present invention.

Figure 1:
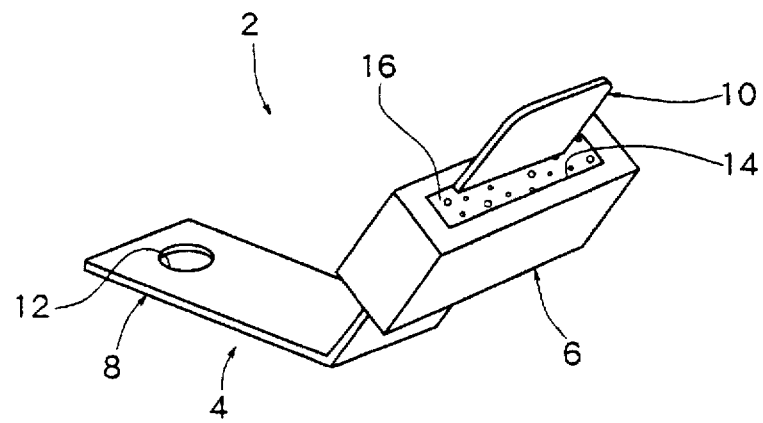
FIG. 1 is a perspective view showing a first preferred embodiment of a grounding device constructed in accordance with the present invention.
Figure 2:
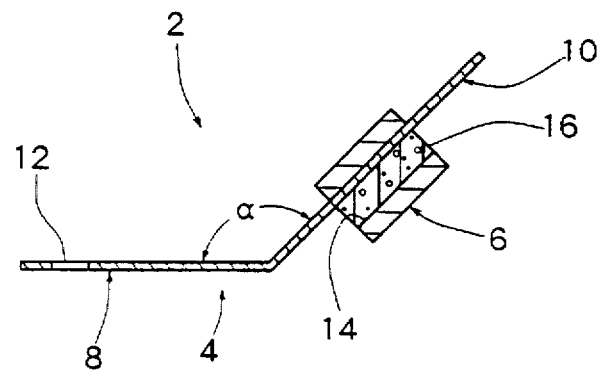
FIG. 2 is a sectional view of the grounding device shown in FIG. 1.

Referring to FIGS. 1 and 2, a grounding device, generally designated by 2, is composed of an electric conductive member 4 and radio wave absorbing means 6. The electric conductive member 4 is formed of a metal plate having a first portion 8 and a second portion 10 extending at a bending angle, α, of optionally about 120 to 150 degrees to the first portion 8. A connecting hole 12 is formed in the first portion 8 of the metal plate constituting the electric conductive member 4. The metal plate is preferably formed of a metal, such as bronze or spring steel, which has sufficiently low electric resistance and relatively high modulus of elasticity. The radio wave absorbing means 6 is composed of a radio wave absorbing member having a through-hole 14 formed therein. The contour of the radio wave absorbing member is a rectangular parallelepiped, and the cross sectional shape of the through-hole 14 is rectangular, so that the radio wave absorbing member is generally in the shape of a rectangular tube. It is important that the radio wave absorbing member constituting the radio wave absorbing means 6 be formed of a material capable of effectively absorbing radiated noise, and preferably, a material containing sintered ferrite or ferrite particles. A preferred example of the radio wave absorbing member is a radio wave absorbing member consisting essentially of sintered ferrite in various shapes that is marketed as "a ferrite core for electromagnetic interference prevention" by Kitagawa Kogyo Co., Ltd., located at 2-4-15, Nihonbashi-Muromachi, Chuo-ku, Tokyo.

As clearly shown in FIGS. 1 and 2, the second portion 10 of the metal plate constituting the electric conductive member 4 extends through the through-hole 14 of the radio wave absorbing member constituting the radio wave absorbing means 6. A filler member 16 is elastically compressed and inserted into the space between one side surface of the through-hole 14 and one surface of the second portion 10 of the metal plate, whereby the radio wave absorbing member is fixed to the second portion 10 of the metal plate. The filler member 16 may be formed of a flexible material such as sponge. The other surface of the metal plate is in direct contact with the other side surface of the through-hole 14. The metal plate and the radio wave absorbing member need not necessarily be contacted directly with each other, and if desired, a filler member may be inserted between the other surface of the metal plate and the other side surface of the through-hole 14.

If the grounding device 2 as shown in FIGS. 1 and 2 is used to electrically connect together two electric conductive constituent elements (not shown) to be grounded in an image forming machine, it is recommended to use, for instance, to a nut or set screw (not shown) to be inserted into the connecting hole 12, thereby connecting the first portion 8 of the metal plate to one of the constituent elements, and elastically contacting the second portion 10 of the metal plate with the other constituent element. One of these constituent elements is connected to a ground terminal directly or via a further electric conductive member. By using the grounding device 2 in this manner, the two constituent elements are electrically connected together fully satisfactorily. Thus, an electric current or voltage, a possible cause of conducted noise, is led to earth through the electric conductive member 4, whereby the generation of conducted noise is effectively suppressed. As an electric current flows through the electric conductive member 4, radio waves are radiated thereby. Such radio waves are fully effectively absorbed by the radio wave absorbing means 6, so that the generation of radiated noise is also effectively suppressed. If the radio wave absorbing means 6 is not associated with the electric conductive member 4, considerable radiated noise, especially radiated noise in a high frequency band (more than 100 MHz), is likely to occur because of an electric current flowing through the electric conductive member 4.

Figure 3:
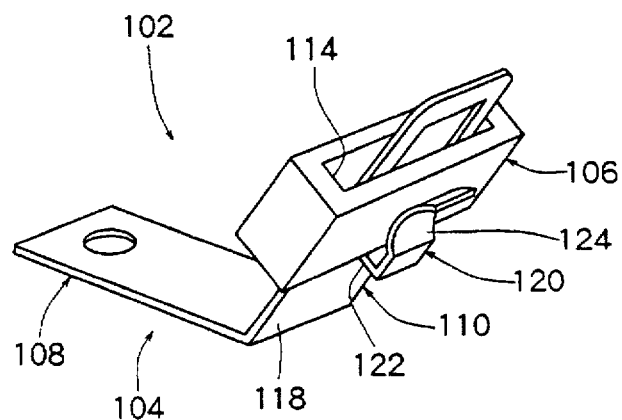
FIG. 3 is a perspective view showing a second preferred embodiment of a grounding device constructed in accordance with the invention.
Figure 4:
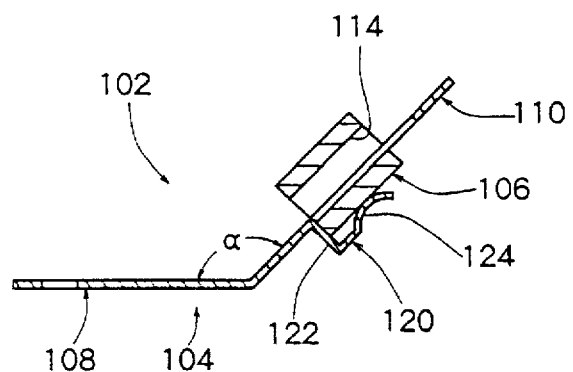
FIG. 4 is a sectional view of the grounding device shown in FIG. 3.

FIGS. 3 and 4 show a second preferred embodiment of a grounding device constructed in accordance with the present invention. A grounding device 102 illustrated in FIGS. 3 and 4 also comprises an electric conductive member 104 composed of a metal plate, and radio wave absorbing means 106 composed of a radio wave absorbing member having a through-hole 114. The electric conductive member 104 is formed of a metal plate having a first portion 108 and a second portion 110 extending at a bending angle, α, of optionally about 120 to 150 degrees to the first portion 108. The second portion 110 of the metal plate has a main portion 118, and a locking arm 120 integrally joined to the main portion 118. The locking arm 120 is formed by punching and bending a part of the main portion 118. The locking arm 120 has a base portion 122 extending from the main portion 118 substantially perpendicularly thereto, and an arm portion 124 extending from the forward end of the base portion 122 nearly parallel to the main portion 118. A tip portion of the arm portion 124 is shaped like an arch. The main portion 118 of the second portion 110 is inserted into the through-hole 114 of the radio wave absorbing member, with one end of the radio wave absorbing member making contact with the base portion 122 of the locking arm 120. The arcuate tip portion of the arm portion 124 of the locking arm 120 is brought into elastic contact with the outer surface of the radio wave absorbing member. Thus, one side wall of the radio wave absorbing member is elastically sandwiched between the main portion 118 of the second portion 110 of the metal plate and the locking arm 120. As a result, the radio wave absorbing member is fixed to the second portion 110 of the metal plate. Those matters of the grounding device 102 in FIGS. 3 and 4 other than the above-described construction (e.g., the materials of the metal plate and the radio wave absorbing member, and the manner of use of the grounding device) may be substantially the same as in the grounding device 2 illustrated in FIGS. 1 and 2.

Figure 5:
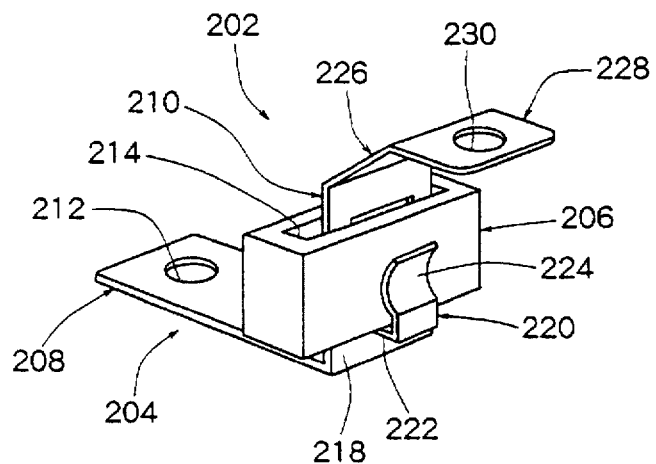
FIG. 5 is a perspective view showing a third preferred embodiment of a grounding device constructed in accordance with the invention.
Figure 6:
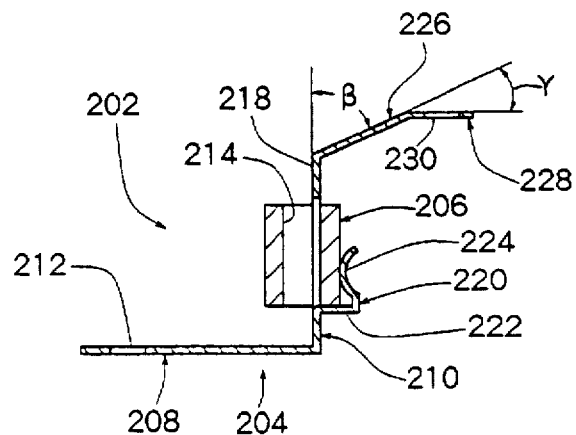
FIG. 6 is a sectional view of the grounding device shown in FIG. 5.

FIGS. 5 and 6 show a third preferred embodiment of a grounding device constructed in accordance with the present invention. A grounding device 202 illustrated in FIGS. 5 and 6 also comprises an electric conductive member 204 composed of a metal plate, and radio wave absorbing means 206 composed of a radio wave absorbing member having a through-hole 214. The metal plate has a first portion 208, a second portion 210 extending substantially perpendicularly to the first portion 208, a third portion 226 extending at a bending angle, β, of optionally about 40 to 80 degrees to the second portion 210, and a fourth portion 228 extending at a bending angle, γ, of (90 - β) degrees to the third portion 224, namely, substantially parallel to the first portion 208. Like the second portion 110 of the metal plate shown in FIGS. 3 and 4, the second portion 210 of the metal plate has a main portion 218, and a locking arm 220 integrally joined to the main portion 218. The locking arm 220 is formed by punching and bending a part of the main portion 218. The locking arm 220 has a base portion 222 extending from the main portion 218 substantially perpendicularly thereto, and an arm portion 224 extending from the forward end of the base portion 222 nearly parallel to the main portion 218. A tip portion of the arm portion 224 is arcuate. The first portion 208 of the metal plate has a connecting hole 212, while the fourth portion 228 of the metal plate has a connecting hole 230. In the grounding device 202 shown in FIGS. 5 and 6, the radio wave absorbing member constituting the radio wave absorbing means 206 is fed onto the second portion 210 past the fourth portion 228 and the third portion 226 of the metal plate. The main portion 218 of the second portion 210 extends so as to pass through the through-hole 214 of the radio wave absorbing member, with one end of the radio wave absorbing member making contact with the base portion 222 of the locking arm 220. The arcuate tip portion of the arm portion 224 of the locking arm 220 is brought into elastic contact with the outer surface of the radio wave absorbing member. Thus, one side wall of the radio wave absorbing member is elastically sandwiched between the main portion 218 of the second portion 210 of the metal plate and the locking arm 220. Consequently, the radio wave absorbing member is fixed to the second portion 210 of the metal plate.

If the grounding device 202 as shown in FIGS. 5 and 6 is used to electrically connect together two electric conductive constituent elements (not shown) to be grounded in an image forming machine, it is recommended to use, for instance, to a nut or set screw (not shown) to be inserted into the connecting hole 212 formed in the first portion 208 of the metal plate, thereby connecting the first portion 208 of the metal plate to one of the constituent elements. Furthermore, a nut or set screw (not shown) to be inserted into the connecting hole 230 formed in the fourth portion 228 of the metal plate may be used to connect the fourth portion 228 of the metal plate to the other constituent element. Those matters of the grounding device 202 in FIGS. 5 and 6 other than the above-described construction may be substantially the same as in the grounding device 2 illustrated in FIGS. 1 and 2.

Figure 7:
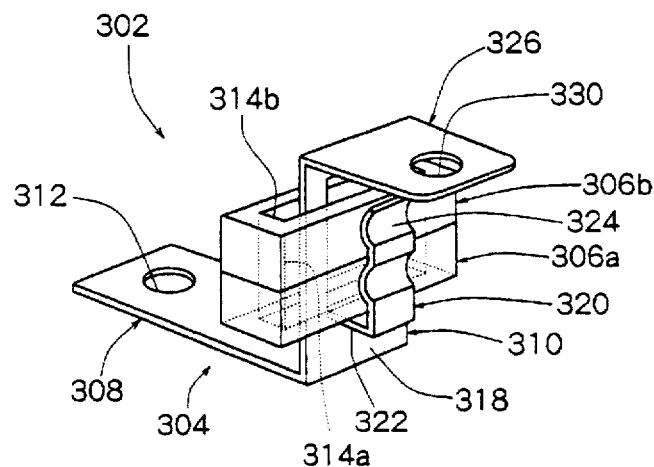
FIG. 7 is a perspective view showing a fourth preferred embodiment of a grounding device constructed in accordance with the invention.

FIG. 7 shows a fourth preferred embodiment of a grounding device constructed in accordance with the present invention. A grounding device 302 illustrated in FIG. 7 comprises an electric conductive member 304 composed of a metal plate, and two radio wave absorbing means 306a and 306b associated with this electric conducting member 304. Each of the two radio wave absorbing means 306a and 306b is composed of a radio wave absorbing member having a through-hole 314a or 314b. The metal plate has a first portion 308, a second portion 310 extending substantially perpendicularly to the first portion 308, and a third portion 326 extending substantially perpendicularly to the second portion 310, namely, substantially parallel to the first portion 308. Like the second portion 110 of the metal plate shown in FIGS. 3 and 4, the second portion 310 of the metal plate has a main portion 318, and a locking arm 320 integrally joined to the main portion 318. The locking arm 320 is formed by punching and bending a part of the main portion 318. The locking arm 320 has a base portion 322 extending from the main portion 318 substantially perpendicularly thereto, and an arm portion 324 extending from the forward end of the base portion 322 nearly parallel to the main portion 318. Two arcuate portions are formed in the arm portion 324. The first portion 308 of the metal plate has a connecting hole 312, while the third portion 326 of the metal plate has a connecting hole 330. The contour of each of the radio wave absorbing members constituting the radio wave absorbing means 306a and 306b is a rectangular parallelepiped, and the cross sectional shape of each of the through-holes 314a and 314b is rectangular, so that each of the radio wave absorbing members is generally in the shape of a rectangular tube. It is important for the radio wave absorbing members constituting the radio wave absorbing means 306a and 306b to be different from each other in radio wave absorbing properties. The radio wave absorbing properties of a radio wave absorbing member are determined by the content of ferrite, the kind and/or the incorporated amount of an incorporated magnetic material other than ferrite, or the shape of sintered ferrite, as those skilled in the art know well. Hence, the radio wave absorbing means 306a and 306b may be composed of two radio wave absorbing members different from each other in the content of ferrite, the kind and/or the incorporated amount of an incorporated magnetic material other than ferrite, or the shape of sintered ferrite.

In the grounding device 302 shown in FIG. 7, the two radio wave absorbing members constituting the radio wave absorbing means 306a and 306b are fed onto the second portion 310 past the third portion 326 of the metal plate. The main portion 318 of the second portion 310 extends so as to pass through the through-holes 314a and 314b of the two radio wave absorbing members. One end (lower end) of the radio wave absorbing member constituting the radio wave absorbing means 306a is in contact with the base portion 322 of the locking arm 320. One end (lower end) of the radio wave absorbing member constituting the radio wave absorbing means 306b is in contact with the other end (upper end) of the radio wave absorbing member constituting the radio wave absorbing means 306a. If desired, there may be a gap between the other end (upper end) of the radio wave absorbing member constituting the radio wave absorbing means 306a and the one end (lower end) of the radio wave absorbing member constituting the radio wave absorbing means 306b. One of the arcuate portions (the lower arcuate portion) of the arm portion 324 of the locking arm 320 is brought into elastic contact with the outer surface of the radio wave absorbing member constituting the radio wave absorbing member 306a, while the other arcuate portion (the upper arcuate portion) of the arm portion 324 of the locking arm 320 is brought into elastic contact with the outer surface of the radio wave absorbing member constituting the radio wave absorbing member 306b. Thus, one side wall of each of the two radio wave absorbing members is elastically sandwiched between the main portion 318 of the second portion 310 of the metal plate and the locking arm 320. Consequently, the two radio wave absorbing members are fixed to the second portion 310 of the metal plate.

If the grounding device 302 as shown in FIG. 7 is used to electrically connect together two electric conductive constituent elements (not shown) to be grounded in an image forming machine, it is recommended to use, for instance, to a nut or set screw (not shown) to be inserted into the connecting hole 312 formed in the first portion 308 of the metal plate, thereby connecting the first portion 308 of the metal plate to one of the constituent elements. Furthermore, a nut or set screw (not shown) to be inserted into the connecting hole 330 formed in the third portion 326 of the metal plate may be used to connect the third portion 326 of the metal plate to the other constituent element. Those matters of the grounding device 302 in FIG. 7 other than the above-described construction may be substantially the same as in the grounding device 2 illustrated in FIGS. 1 and 2.

Figure 8:
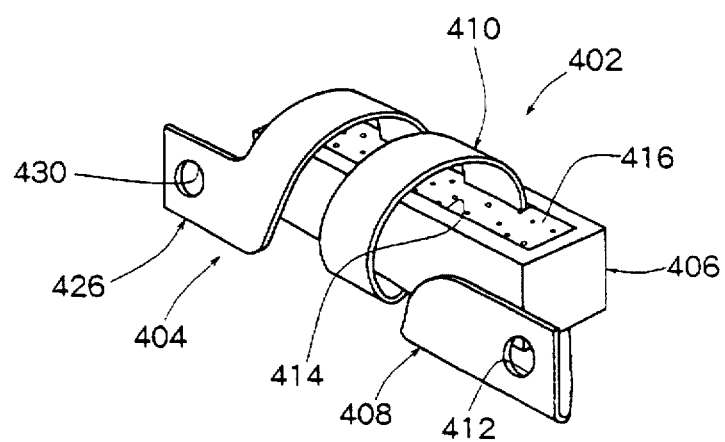
FIG. 8 is a perspective view showing a fifth preferred embodiment of a grounding device constructed in accordance with the invention.
Figure 9:
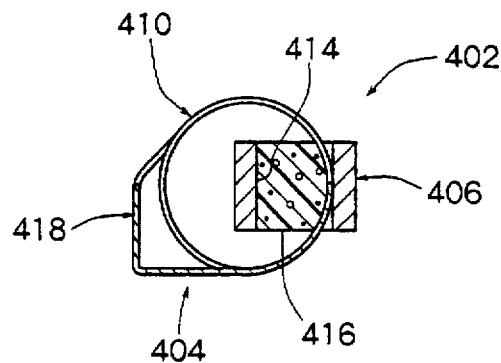
FIG. 9 is a sectional view of the grounding device shown in FIG. 8.

FIGS. 8 and 9 show a fifth preferred embodiment of a grounding device constructed in accordance with the present invention. A grounding device 402 illustrated in FIGS. 5 and 6 also comprises an electric conductive member 404, and radio wave absorbing means 406 associated with this electric conducting member 404. The electric conductive member 404 is formed of a metal plate, and has a first portion 408, a second portion 410, and a third portion 426. The first portion 408 and the third portion 426 are substantially flat, while the second portion 410 extends helically between the first portion 408 and the third portion 426. The first portion 408 has a connecting hole 412, while the third portion 426 has a connecting hole 430. The radio wave absorbing means 406 is composed of a radio wave absorbing member having a through-hole 414. The contour of the radio wave absorbing member is a transversely rectangular parallelepiped, and the cross sectional shape of the through-hole 414 is transversely rectangular. The second portion 410 of the metal plate constituting the electric conductive member 404 extends helically through the through-hole 414 of the radio wave absorbing member so as to pass twice through the through-hole 414 as will be clearly understood from FIG. 8. An elastically compressed filler member 416 is inserted between one side surface of the through-hole 414 and the inner peripheral surface of the second portion 410 of the metal plate. The radio wave absorbing member is thereby fixed to the second portion 410 of the metal plate.

If the grounding device 402 as shown in FIGS. 8 and 9 is used to electrically connect together two electric conductive constituent elements (not shown) to be grounded in an image forming machine, it is recommended to use, for instance, to a nut or set screw (not shown) to be inserted into the connecting hole 412 formed in the first portion 408 of the metal plate, thereby connecting the first portion 408 of the metal plate to one of the constituent elements. Furthermore, a nut or set screw (not shown) to be inserted into the connecting hole 430 formed in the third portion 426 of the metal plate may be used to connect the third portion 426 of the metal plate to the other constituent element. Those matters of the grounding device 402 in FIGS. 8 and 9 other than the above-described construction may be substantially the same as in the grounding device 2 illustrated in FIGS. 1 and 2.

Figure 10:
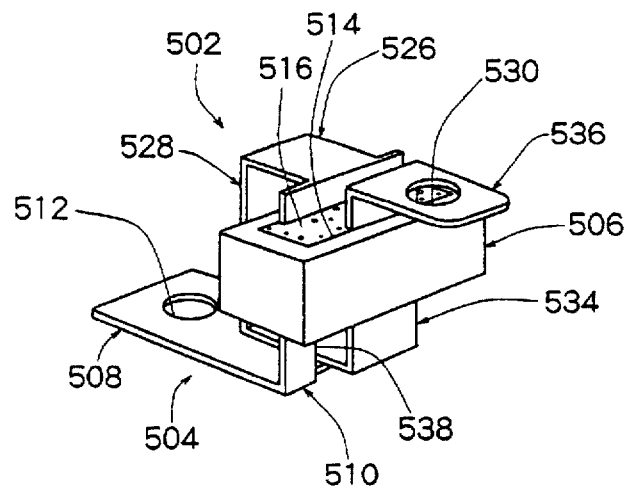
FIG. 10 is a perspective view showing a sixth preferred embodiment of a grounding device constructed in accordance with the invention.
Figure 11:
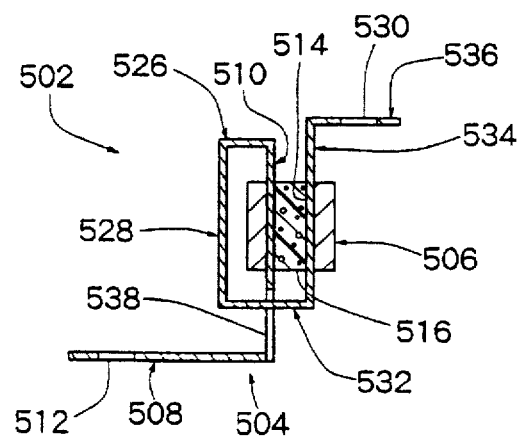
FIG. 11 is a sectional view of the grounding device shown in FIG. 10.

FIGS. 10 and 11 show a sixth preferred embodiment of a grounding device constructed in accordance with the present invention. A grounding device 502 illustrated in FIGS. 10 and 11 also comprises an electric conductive member 504 composed of a metal plate, and radio wave absorbing means 506 composed of a radio wave absorbing member having a through-hole 514. The metal plate has a first portion 508, a second portion 510 extending substantially perpendicularly to the first portion 508, a third portion 526 extending substantially perpendicularly to the second portion 510, a fourth portion 528 extending substantially perpendicularly to the third portion 526, a fifth portion 532 extending substantially perpendicularly to the fourth portion 528, a sixth portion 534 extending substantially perpendicularly to the fifth portion 532, and a seventh portion 536 extending substantially perpendicularly to the sixth portion 534. The widths of the first portion 508 and the second portion 510 are relatively large, while the widths of the third portion 526, the fourth portion 528, the fifth portion 532, the sixth portion 534 and the seventh portion 536 are relatively small. A rectangular opening 538 is formed in the second portion 510, and the fifth portion 532 extends through this opening 538. The first portion 508 and the seventh portion 536 extend substantially parallel to each other, and the second portion 510 and the sixth portion 534 also extend substantially parallel to each other. A connecting hole 512 is formed in the first portion 508, and a connecting hole 530 is formed in the seventh portion 536. The radio wave absorbing member is generally shaped like a rectangular tube. The sixth portion 534 and the second portion 510 of the metal plate, extend through the through-hole 514 of the radio wave absorbing member. Thus, the metal plate extends so as to be passed twice through the through-hole 514 of the radio wave absorbing member. An elastically compressed filler member 516 is inserted between the second portion 510 and the sixth portion 534 within the through-hole 514 of the radio wave absorbing member. By the elastic action of the filler member 516, the second portion 510 is pressed against one side surface of the through-hole 514, whereas the sixth portion 534 is pressed against the other side surface of the through-hole 514, whereby the radio wave absorbing member is fixed to the metal plate.

If the grounding device 502 as shown in FIGS. 10 and 11 is used to electrically connect together two electric conductive constituent elements (not shown) to be grounded in an image forming machine, it is recommended to use, for instance, to a nut or set screw (not shown) to be inserted into the connecting hole 512 formed in the first portion 508 of the metal plate, thereby connecting the first portion 508 of the metal plate to one of the constituent elements. Furthermore, a nut or set screw (not shown) to be inserted into the connecting hole 530 formed in the seventh portion 536 of the metal plate may be used to connect the seventh portion 536 of the metal plate to the other constituent element. Those matters of the grounding device 502 in FIGS. 10 and 11 other than the above-described construction may be substantially the same as in the grounding device 2 illustrated in FIGS. 1 and 2.

Figure 12:
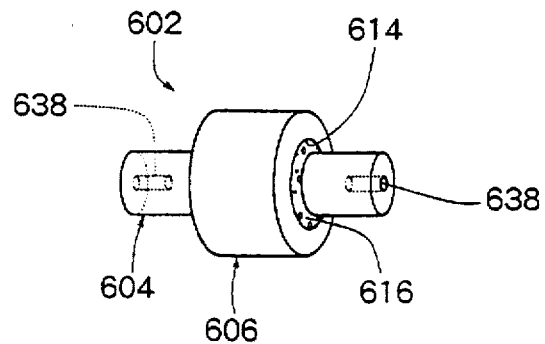
FIG. 12 is a perspective view showing a seventh preferred embodiment of a grounding device constructed in accordance with the invention.
Figure 13:
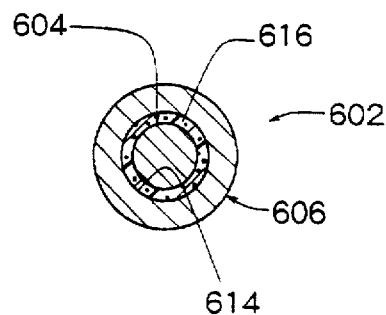
FIG. 13 is a sectional view of the grounding device shown in FIG. 12.

FIGS. 12 and 13 show a seventh preferred embodiment of a grounding device constructed in accordance with the present invention. A grounding device generally designated by 602 comprises an electric conductive member 604, and radio wave absorbing means 606 associated with this electric conductive member 604. The electric conductive member 604 is composed of a metal bar having a circular cross-sectional shape. Internal threaded holes 638 are formed at both ends of the metal bar, which may be formed of a suitable metal with high electric conductivity. The radio wave absorbing means 606 is composed of a cylindrical radio wave absorbing member, which has a through-hole 614 circular in cross-section. Preferred examples of the radio wave absorbing member are a cylindrical radio wave absorbing member consisting essentially of sintered ferrite that is marketed as "a ferrite core for electromagnetic interference prevention" by the aforementioned Kitagawa Kogyo Co., Ltd., and a cylindrical or toroidal radio wave absorbing member marketed as "a radio wave absorbing electromagnetic shield IM material" by TDK Corp., located at 1-13-1, Nihonbashi-Muromachi, Chuo-ku, Tokyo. The metal bar constituting the electric conductive member 604 is inserted through the through-hole 614 of the radio wave absorbing member. A cylindrical filler member 616 is elastically compressed and filled between the outer peripheral surface of the metal bar and the peripheral side surface of the through-hole 614. The radio wave absorbing member is fixed to the metal bar thereby.

If the grounding device 602 as shown in FIGS. 12 and 13 is used to electrically connect together two electric conductive constituent elements (not shown) to be grounded in an image forming machine, it is recommended to use, for instance, a connecting screw (not shown) screwed into the internal threaded hole 638 formed at one end of the metal bar through a connecting hole formed in one of the constituent elements, thereby connecting the one of the constituent elements to the one end of the metal bar. Furthermore, a second connecting screw (not shown) is screwed into the internal threaded hole 638 formed at the other end of the metal bar through a connecting hole formed in the other constituent element, thereby connecting the other constituent element to the other end of the metal bar. Those matters of the grounding device 602 in FIGS. 12 and 13 other than the above-described construction may be substantially the same as in the grounding device 2 illustrated in FIGS. 1 and 2.

Figure 14:
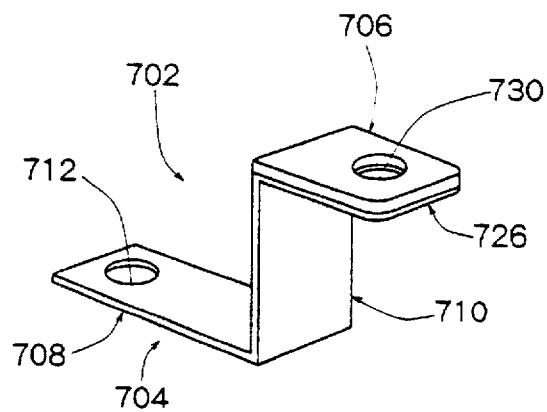
FIG. 14 is a perspective view showing an eighth preferred embodiment of a grounding device constructed in accordance with the invention.

FIG. 14 shows an eighth preferred embodiment of a grounding device constructed in accordance with the present invention. A grounding device 702 illustrated in FIG. 14 also comprises an electric conductive member 704, and radio wave absorbing means 706 associated with this electric conductive member 704. The electric conductive member 704 is composed of a metal plate, which has a first portion 708, a second portion 710 extending substantially perpendicularly to the first portion 708, and a third portion 726 extending substantially perpendicularly to the second portion 710, namely, substantially parallel to the first portion 708. The radio wave absorbing means 706 is composed of a radio wave absorbing sheet piece. This radio wave absorbing sheet piece is bonded to one surface of the third portion 726 of the metal plate by suitable bonding means such as a double-sided adhesive tape or an adhesive. It is important for the radio wave absorbing sheet piece to be able to absorb radiated noise effectively. Preferred examples of the radio wave absorbing sheet piece are a radio wave absorbing sheet piece, which comprises ferrite particles dispersed in synthetic rubber, marketed as "a radio wave absorbing electromagnetic shield IR material" by TDK Corp., and a radio wave absorbing sheet piece consisting essentially of sintered ferrite that is also marketed as "a radio wave absorbing electromagnetic shield IB material" by TDK Corp. As clearly seen in FIG. 14, a connecting hole 712 is formed in the first portion 708 of the metal plate, while a connecting hole 730 is formed in the third portion 726 of the metal plate and the radio wave absorbing sheet piece bonded to it.

If the grounding device 702 as shown in FIG. 14 is used to electrically connect together two electric conductive constituent elements (not shown) to be grounded in an image forming machine, it is recommended to use, for instance, a nut or set screw (not shown) to be inserted into the connecting hole 712 formed in the first portion 708 of the metal plate, thereby connecting the first portion 708 of the metal plate to one of the constituent elements. Furthermore, a nut or set screw (not shown) to be inserted into the connecting hole 730 formed in the third portion 726 of the metal plate and the radio wave absorbing sheet piece may be used to connect the third portion 726 of the metal plate to the other constituent element. In this case, it is preferred to interpose the radio wave absorbing sheet piece between the third portion 726 of the metal plate and the other constituent element. Those matters of the grounding device 702 in FIG. 14 other than the above-described construction may be substantially the same as in the grounding device 2 illustrated in FIGS. 1 and 2.

Figure 15:
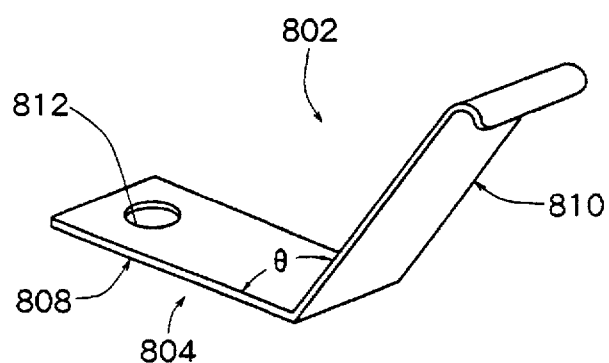
FIG. 15 is a perspective view showing a ninth preferred embodiment of a grounding device constructed in accordance with the invention.
Figure 16:
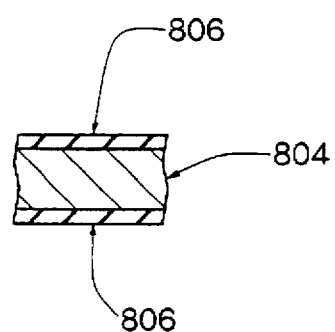
FIG. 16 is a sectional view of the grounding device shown in FIG. 15.

FIGS. 15 and 16 show a ninth preferred embodiment of a grounding device constructed in accordance with the present invention. A grounding device 802 illustrated in FIGS. 15 and 16 also comprises an electric conductive member 804, and radio wave absorbing means 806. The electric conductive member 804 is composed of a metal plate, which has a first portion 808, and a second portion 810 extending at a bending angle, θ, of optionally about 100 to 140 degrees to the first portion 808. A tip portion of the second portion 810 is arcuate. The first portion 808 of the metal plate has a connecting hole 812. As will be seen by reference to FIG. 16, a radio wave absorbing paint is coated onto the surface of the metal plate constituting the electric conductive member 804, and the radio wave absorbing means 806 is composed of such a radio wave absorbing paint. Preferably, the radio wave absorbing paint is applied to the entire surface of the metal plate. It is important for the radio wave absorbing paint to be able to absorb radiated noise effectively. A preferred example of the radio wave absorbing paint is a radio wave absorbing paint, which comprises ferrite particles dispersed in liquid synthetic rubber, marketed as "a radio wave absorbing electromagnetic shield IL material" by TDK Corp.

If the grounding device 802 as shown in FIGS. 15 and 16 is used to electrically connect together two electric conductive constituent elements (not shown) to be grounded in an image forming machine, it is recommended to use, for instance, a nut or set screw (not shown) to be inserted into the connecting hole 812 formed in the first portion 808 of the metal plate, thereby connecting the first portion 808 of the metal plate to one of the constituent elements. Furthermore, an upper end part of the second portion 810 of the metal plate may be elastically contacted with the other constituent element. Those matters of the grounding device 802 in FIGS. 15 and 16 other than the above-described construction may be substantially the same as in the grounding device 2 illustrated in FIGS. 1 and 2.

While some preferred embodiments of a grounding device constructed in accordance with the present invention have been described in detail with reference to the accompanying drawings, it is to be understood that the invention is in no way limited thereto, but various changes and modifications may be made without departing from the spirit and scope of the invention.

What we claim is:

1. A grounding device for use with an image forming machine, said grounding device comprising an electric conductive member, and radio wave absorbing means associated with said electric conductive member, wherein:

said radio wave absorbing means comprises a radio wave absorbing member having a through-hole, and said electric conductive member is formed of a metal plate and is passed through said through-hole of said radio wave absorbing member a plurality of times.

2. The grounding device of claim 1, wherein said radio wave absorbing member contains sintered ferrite or ferrite particles.

3. The grounding device of claim 1, further comprising an elastically compressible filler member compressed between the inner surface of said through-hole of said radio wave absorbing member and said metal plate, fixing said radio wave absorbing member to said electric conductive member.

4. The grounding device of claim 1, wherein said electric conductive member is formed of a metal plate having a main portion and a locking arm integrally joined to said main portion, said main portion of said metal plate extends through said through hole of said radio wave absorbing member, and said locking arm elastically engages the outer surface of said radio wave absorbing member, fixing said radio wave absorbing member to said electric conductive member.

5. The grounding device of claim 1, wherein:

said radio wave absorbing means is composed of two radio wave absorbing members different from each other in radio wave absorbing properties, each of said two radio wave absorbing member has a through-hole, and at least a part of said electric conductive member extends through the through hole of each of said two radio wave absorbing members.

\* \* \* \* \*